(12) United States Patent
Watanabe et al.

(10) Patent No.: US 9,160,329 B2
(45) Date of Patent: Oct. 13, 2015

(54) CIRCUIT CONTROL DEVICE

(71) Applicant: DENSO CORPORATION, Kariya, Aichi-pref. (JP)

(72) Inventors: Yousuke Watanabe, Okazaki (JP); Junichi Fukuta, Kuwana (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/154,645

(22) Filed: Jan. 14, 2014

(65) Prior Publication Data

US 2014/0197869 A1   Jul. 17, 2014

(30) Foreign Application Priority Data

Jan. 16, 2013   (JP) ................. 2013-005651

(51) Int. Cl.
*H03B 1/00*   (2006.01)
*H03K 3/00*   (2006.01)
*H03K 17/18*  (2006.01)

(52) U.S. Cl.
CPC ..................................... *H03K 17/18* (2013.01)

(58) Field of Classification Search
USPC ......... 327/108–112, 425, 427, 432, 434, 437, 327/398; 326/82, 83; 363/131, 95, 97, 50; 323/282, 284
See application file for complete search history.

(56) References Cited

U.S. PATENT DOCUMENTS

2010/0141304 A1* 6/2010 Miyazaki ................. 327/109

FOREIGN PATENT DOCUMENTS

| JP | 63-114594 | 5/1988 |
| JP | 6-14558 | 1/1994 |
| JP | 06014558 A * | 1/1994 |
| JP | 9-289780 | 11/1997 |
| JP | 2007-306758 | 11/2007 |
| JP | 2009-017671 | 1/2009 |

OTHER PUBLICATIONS

Office Action (2 pages) dated Nov. 18, 2014, issued in corresponding Japanese Application No. 2013-005651 and English translation (2 pages).

* cited by examiner

*Primary Examiner* — Lincoln Donovan
*Assistant Examiner* — Thomas Skibinski
(74) *Attorney, Agent, or Firm* — Nixon & Vanderhye PC

(57) ABSTRACT

A circuit control device controlling a switching circuit which has a semiconductor switching element, having a main controller, a drive signal output portion and an obtaining portion. The main controller outputs a drive control signal. The drive signal output portion receives the drive control signal and outputs a drive signal to the switching element, the switching element acting on the basis of the drive signal. The obtaining portion obtains circuit information on status of the switching circuit in synchronization with the drive control signal.

7 Claims, 10 Drawing Sheets

US 9,160,329 B2

CIRCUIT CONTROL DEVICE

CROSS-REFERENCE TO RELATED APPLICATION

This application is based on and claims the benefit of priority from earlier Japanese Patent Application No. 2013-5651 filed Jan. 16, 2013, the description of which is incorporated herein by reference.

BACKGROUND OF THE INVENTION

1. Technical Field of the Invention

This invention relates a circuit control device that controls a switching circuit.

2. Related Art

In a switching circuit (for example, an inverter) having a semiconductor switching element, malfunction can occur owing to various causes such as fault of the semiconductor switching element. Specifically, for example, spuriously firing an IGBT as the semiconductor switching element can cause a breakdown of the gate to occur. Accordingly, configurations for facilitating determining the above-described causes of occurrence of circuit malfunction have been set forth. In the configurations, a memory for storing data such as on operating status within a predetermined period from past to present is provided (refer to for example, Patent literature 1: Japanese Patent Application Publication No. H06-14558).

In the above-described prior art, writing the data to the memory, however, is stopped, when occurrence of a malfunction is detected. Accordingly, data after the detection of the malfunction cannot be obtained, so that there has been a case where the cause of occurrence of the malfunction cannot be determined.

SUMMARY

An exemplary embodiment according to the invention provides a circuit control device controlling a switching circuit which has a semiconductor switching element, having a main controller, a drive signal output portion and an obtaining portion. The main controller outputs a drive control signal. The drive signal output portion receives the drive control signal and outputs a drive signal to the switching element, the switching element acting on the basis of the drive signal. The obtaining portion obtains circuit information on status of the switching circuit in synchronization with the drive control signal.

Thus, the circuit control device can obtain the circuit information during driven durations of the switching element, while storing the circuit information during non-driven durations of the switching element may be omitted. Therefore, the circuit information after the detection of the malfunction can be used for determining the cause of the malfunction. The efficiency and accuracy of the determination can be improved.

DETAILED DESCRIPTION OF THE PREFERRED EMBODIMENTS

Figure 1:
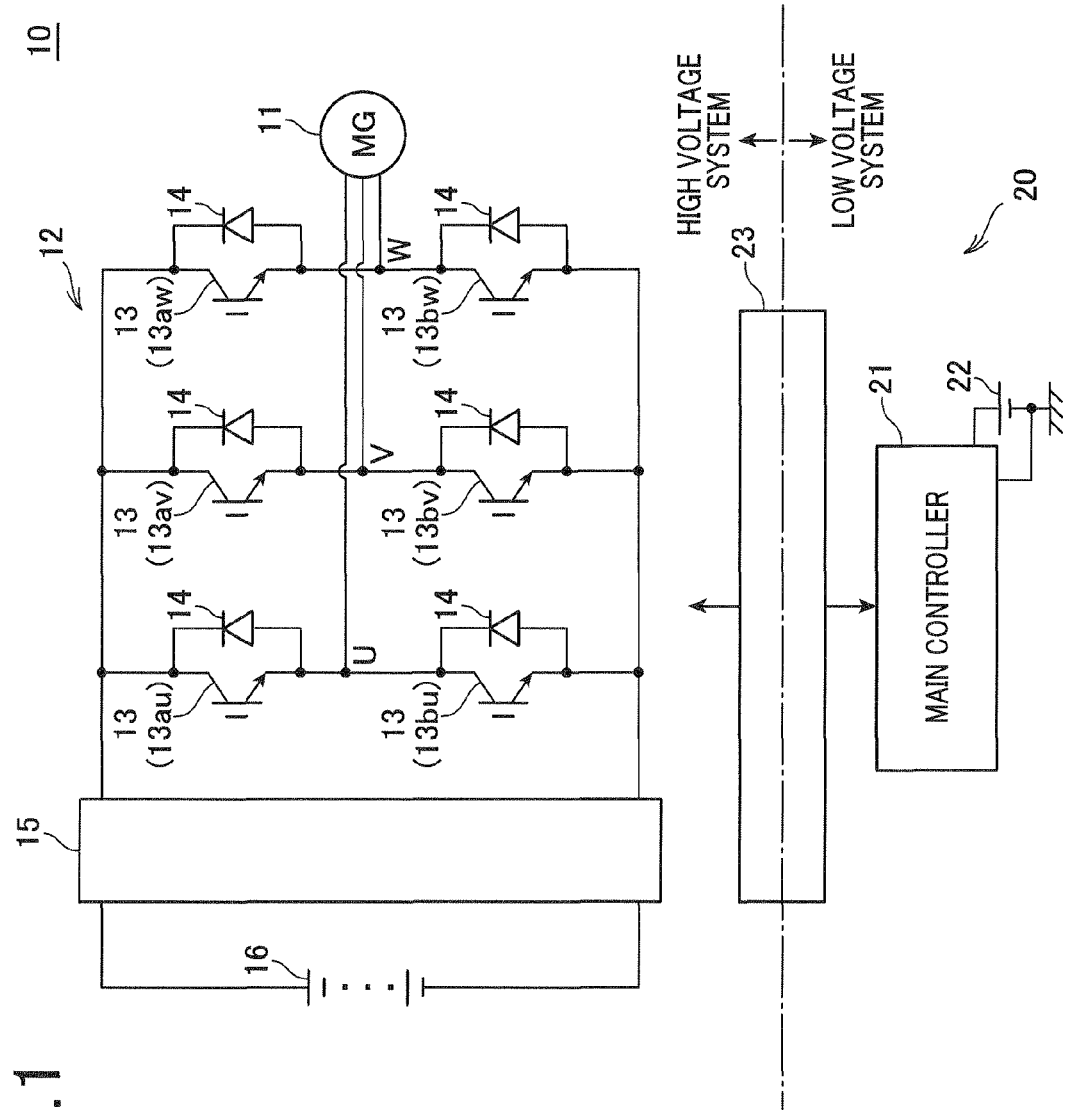
FIG. 1 is a schematic view illustrating an in-vehicle electric motor drive system to which an embodiment according to the invention is applied.

An embodiment to which the present invention is embodied is now described, referring to the drawings.

Configurations of System

FIG. 1 is a schematic diagram showing an in-vehicle electric motor drive system 10 as an example to which the present invention is applied. The in-vehicle electric motor drive system 10 is mounted on a so-called hybrid vehicle or an electric vehicle. The in-vehicle electric motor drive system 10 is provided to control the actuation of a three-phase alternate-current motor generator 11 which is operable as a motor and a generator.

Referring to FIG. 1, the motor generator 11 is electrically connected to an inverter 12 as a switching circuit of the present invention. The inverter 12 has a plurality of semiconductor switching elements 13. In this embodiment, the semiconductor switching element 13 is an insulated gate bipolar transistor (IGBT), and input of a gate signal as a drive signal drives the semiconductor switching element 13.

In this embodiment, the semiconductor switching elements 13*au*, 13*av*, 13*aw* are provided in parallel on the upper arm side of the inverter 12, and the semiconductor elements 13*bu*, 13*bv*, 13*bw* are provided in parallel on the lower arm side of the inverter 12. A pair of the semiconductor switching elements 13*au* and 13*bu* are connected in series, and the connecting point between these switching elements 13*au* and 13*bu* is connected to the U phase. Similarly, a pair of the semiconductor switching elements 13*av* and 13*bv* are connected in series, and the connecting point between these switching elements 13*av* and 13*bv* is connected to the V phase. Furthermore, a pair of the semiconductor switching elements 13*aw* and 13*bw* are connected in series, and the connecting point between these switching elements 13*aw* and 13*bw* is connected to the W phase.

Furthermore, flywheel diodes 14 are respectively connected in inverse-parallel to the semiconductor switching elements 13*au*, 13*av*, 13*aw*, 13*bu*, 13*bv* and 13*bw*. That is, in the flywheel diode 14, the cathode thereof is connected to connected to the collector of the semiconductor switching element 13 (13*au*, 13*av*, 13*aw*, 13*bu*, 13*bv* or 13*bw*), and the anode thereof is connected to the emitter of the semiconductor switching element 13.

The in-vehicle electric motor drive system 10 furthermore has a converter 15 and a high-voltage battery 16. Each collector of the semiconductor switching elements 13*au*, 13*av* and 13*aw* on the upper arm side is connected to the positive terminal of the high-voltage battery through the converter 15. Similarly, each collector of the semiconductor switching elements 13*bu*, 13*bv* and 13*bw* on the lower arm side is connected to the negative terminal of the high-voltage battery through the converter 15. The converter 15 raises the output voltage (for example, 288 V) of the high-voltage battery 16 to a predetermined voltage (for example, 666 V), which is larger than the output voltage of the high-voltage battery 16, as an upper limit.

Configurations of a Circuit Control Device According to the Present Embodiment

The in-vehicle electric motor drive system 10 furthermore has a circuit control device 20 that controls the inverter 12, i.e., each of the semiconductor switching elements 13. The circuit control device 20 according to the present embodiment has a main controller 21, a sub controller 25, a drive signal output portion 24 and a malfunction detection portion 28.

The main controller 21 has a main portion composed by a microcomputer. The main controller 21 is powered by a low-voltage battery 22 to actuate. The main controller 21 is connected to a high-voltage system including the inverter 12 etc. through an interface 23. The interface 23 has a photo coupler (not shown in the drawings), which transfers signals between the high-voltage system where the high-voltage battery 16 is provided and a low-voltage system where the low-voltage battery 22 is provided, electrically isolating these systems from each other.

The sub controller 25, the drive signal output portion 24 and the malfunction detection portion 28 are provided in the high-voltage system. The drive signal output portion 24 and the sub controller 25 are connected to the main controller 21 thorough the interface 23. The drive signal output portion 24 is a so-called driver IC (integrated circuit). The drive signal output portion 24 receives drive control signals from the main controller 21 through the interface 23, and outputs gate signals to the semiconductor switching elements 13.

The sub controller 25, corresponding to the obtaining portion, is electrically connected to various types of sensors (not shown in the drawings) provided in the high-voltage system, and obtains the information (described below as circuit information) on the circuit status in the high-voltage system including the inverter 12. The circuit information includes, for example, the emitter voltage, the collector current, the collector voltage and the gate voltage of the semiconductor switching element 13, the output voltage of a diode provided at the inverter 12 as a temperature sensor, the output voltage of a diode provided at the drive signal output portion 24 as a temperature sensor, voltage of an electrical power supply of the drive signal output portion 24. The sub controller 25 performs various types of processes of the above-described circuit information in synchronization with the drive control signals which the sub controller 25 (described below) receives from the main controller 21 through the interface 23.

Specifically, the sub controller 25 has a storage medium 26 and a storage processing portion 27. The storage medium 26 is a rewritable and non-volatile memory such as a flash memory and EEPROM (trade mark), and stores the circuit information under control by the storage processing portion 27. The storage processing portion 27 is connected to the main controller through the interface 23 to receive the drive control signal which is one (specifically, PWM (pulse width modulation) signal) containing multiple pulses from the main controller 21 through the interface 23.

The storage processing portion 27 is triggered by input of the above-described pulse in the drive control signal to update the stored content of the circuit information in the storage medium 26 serially. Specifically, the storage processing portion 27 has, for example, a pulse detector which samples the input voltage at a period shorter than the pulse period of the drive control signal, and detects a rising edge of the pulse in a given part of pulse duration (drive duration; an ON duty duration+an OFF duty duration in the PWM signal). Then, the storage processing portion 27 detects pulse (the drive control signal) in each pulse duration in synchronization with the pulse period of the drive control signal, and stores on the storage medium 26 the circuit information outputted from the sensors at the time when the drive control signal has been detected. While the data structure etc. in the storage medium 26 is not limited in the present invention, the circuit information is stored in chronological order in this embodiment, i.e., multiple sets (records) of the circuit information which are obtained at different time are stored. Accordingly, in updating, new circuit information is added to the past sets of the circuit information.

Figure 2:
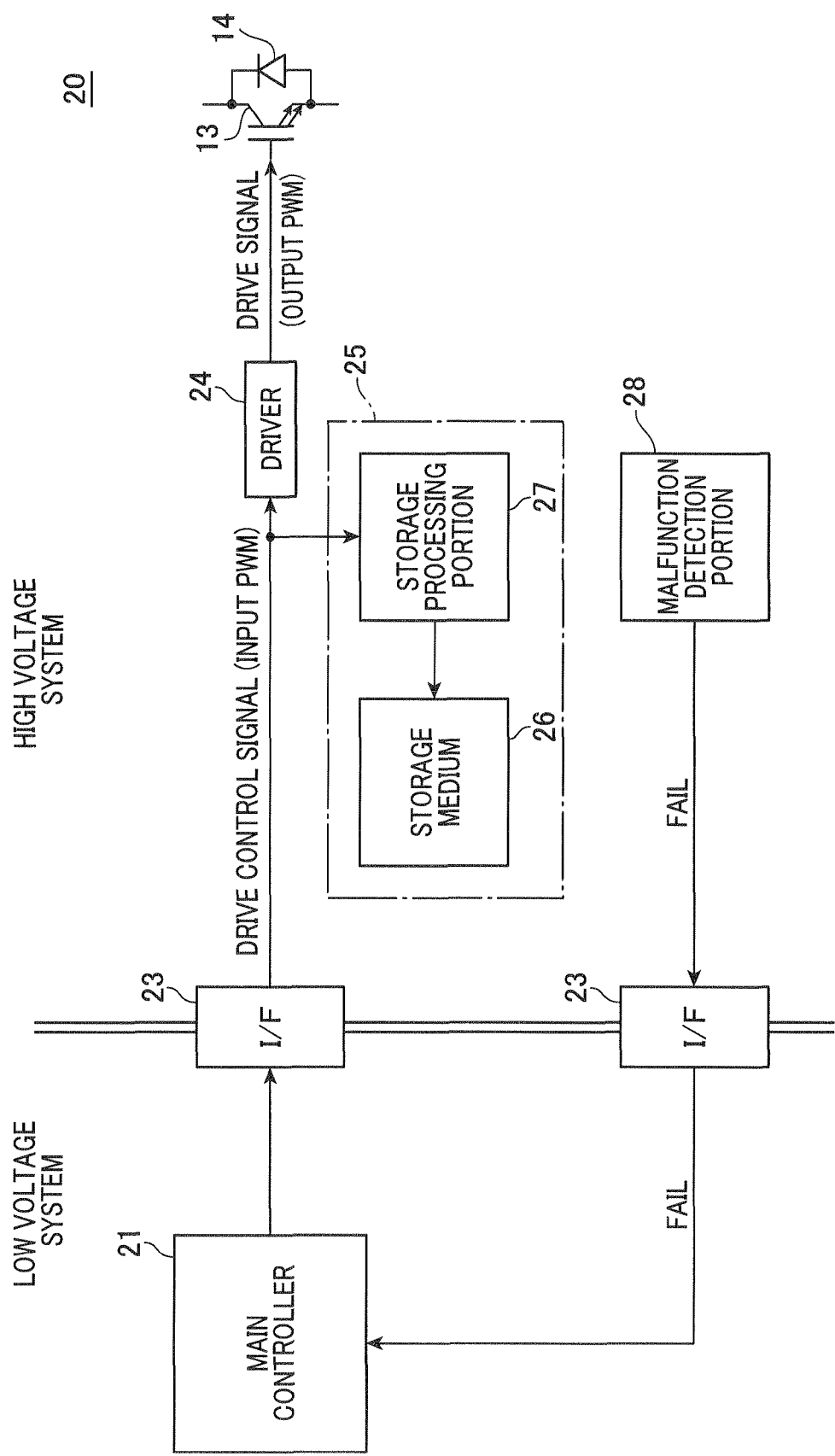
FIG. 2 is a diagram showing functional blocks in an example of a circuit control device shown in FIG. 1.

The malfunction detection portion 28 receives the circuit information from the sub controller 25, and detects occurrence of malfunction (for example, fault of the semiconductor switching element 13) in the high-voltage system including the inverter 12 on the basis of the received circuit information. Then, the malfunction detection portion 28 outputs a malfunction detection signal, when the malfunction has been detected. The main controller 21 outputs the above-described drive control signal to the drive signal output portion 24, and stops the output of the drive control signal when it has received the malfunction detection signal. The drive signal output portions 24, the sub controllers 25 and the malfunction detection portions 28 are provided to correspond to all the semiconductor switching elements 13 shown in FIG. 1 (i.e. such that the circuit control device 20 can respectively handle occurrence of malfunction in the respective semiconductor switching elements 13), though illustration of them in FIG. 2 are omitted for ease of comprehension.

Description of Actuation in the Configurations of the Above-Described Embodiment Hereinafter, the actuation and effects in the configurations of the present embodiment are described, referring to configuration diagrams of FIGS. 1 and 2, and timing chart of FIG. 3. In the timing chart of FIG. 3, the abscissa shows time, and FAIL shows output state of the malfunction detection signal, INPUT PWM shows state of the drive control signal, and STORAGE UPDATE shows state of updating the stored content in the storage medium 26 in synchronization with each pulse in the drive control signal.

In the circuit control device 20 having the above-described configurations according to the present embodiment, the main controller 21 outputs the drive control signal which is a PWM signal, until it receives the malfunction detection signal (Fail) from the malfunction detection portion 28. The drive control signal outputted from the main controller 21 is received by the drive signal output portion 24 and the sub controller 25 through the interface 23. The drive signal output portion 24 outputs the gate signal to the semiconductor switching element 13, while receiving the drive control signal. The storage processing portion 27 is triggered by the above-described input of each pulse to output the circuit information to the storage medium 26 on the basis of the above-described output of the sensors, and to update the stored content of the circuit information (except for the malfunction signal (malfunction information)) in the storage medium 26 serially, while the sub controller 25 receives the drive control signal. The input of each pulse is, specifically, a rising edge or a falling edge of a pulse.

If malfunction (overcurrent, short fault, overheat of an element, open fault, voltage reduction of electrical source, etc.) occurs in the high-voltage system including the inverter 12, the malfunction detection portion 28 detects the occurrence of the malfunction, thereafter outputs the malfunction detection signal. When the main controller 21 receives the outputted malfunction detection signal through the interface 23, it stops the output of the drive control signal. When the output of the drive control signal from the main controller 21 stops, the actuation of updating the stored content of the circuit information in the storage medium 26 in synchronization with the input of the malfunction detection signal stops. For this, the circuit information for a certain amount of time before or after the occurrence of malfunction can be stored in the storage medium 26. Thus, the circuit information stored in the storage medium 26 can be read by the main controller 21 or other eternal devices to be used for determining the cause of the occurrence of malfunction.

Here, in the case where malfunction occurs in the high-voltage system, it takes some time (Δt in FIG. 3) from the time (time t1 in FIG. 3) when the malfunction detection portion 28 detects the occurrence of malfunction and outputs the malfunction detection signal to the time (time t2 in FIG. 3) when updating the circuit information in the storage medium 26 is stopped. That is, after time t1 in FIG. 3, the malfunction detection signal outputted from the malfunction detection portion 28 is received in the main controller 21, then the main controller 21 which has received the malfunction detection signal stops the output of the drive control signal, and then updating the circuit information in the storage medium 26 is stopped on the basis of stopping the output of the drive control signal. Therefore, a sequence of predetermined actuations from time t1 to time t2 in FIG. 3 causes a certain amount of delay in control.

As described above, in the present embodiment, by using the delay in control, the circuit information for a certain amount of time before and after the occurrence of malfunction can be obtained with low processing load (that is, for example, without using a timer interrupt processing for counting the above-described time Δt). Therefore, the present embodiment can provide the configuration which can determine the cause of occurrence of malfunction in the high-voltage system further efficiently.

Modifications

Hereinafter, some modifications are described. In the following descriptions, the same reference symbols are used for the parts corresponding to the parts of the above-described embodiment. Then, the explanations in the above-described embodiment are applied for the following modifications as long as there is no technical contradiction. A part of the above-described embodiment and a part or all of the following modifications may be arbitrarily combined as long as there is no technical contradiction.

The present invention is not limited to the above-described device configurations and actuation. For example, the interface 23 is not limited to an electrical insulator, or may be omitted.

Figure 4:
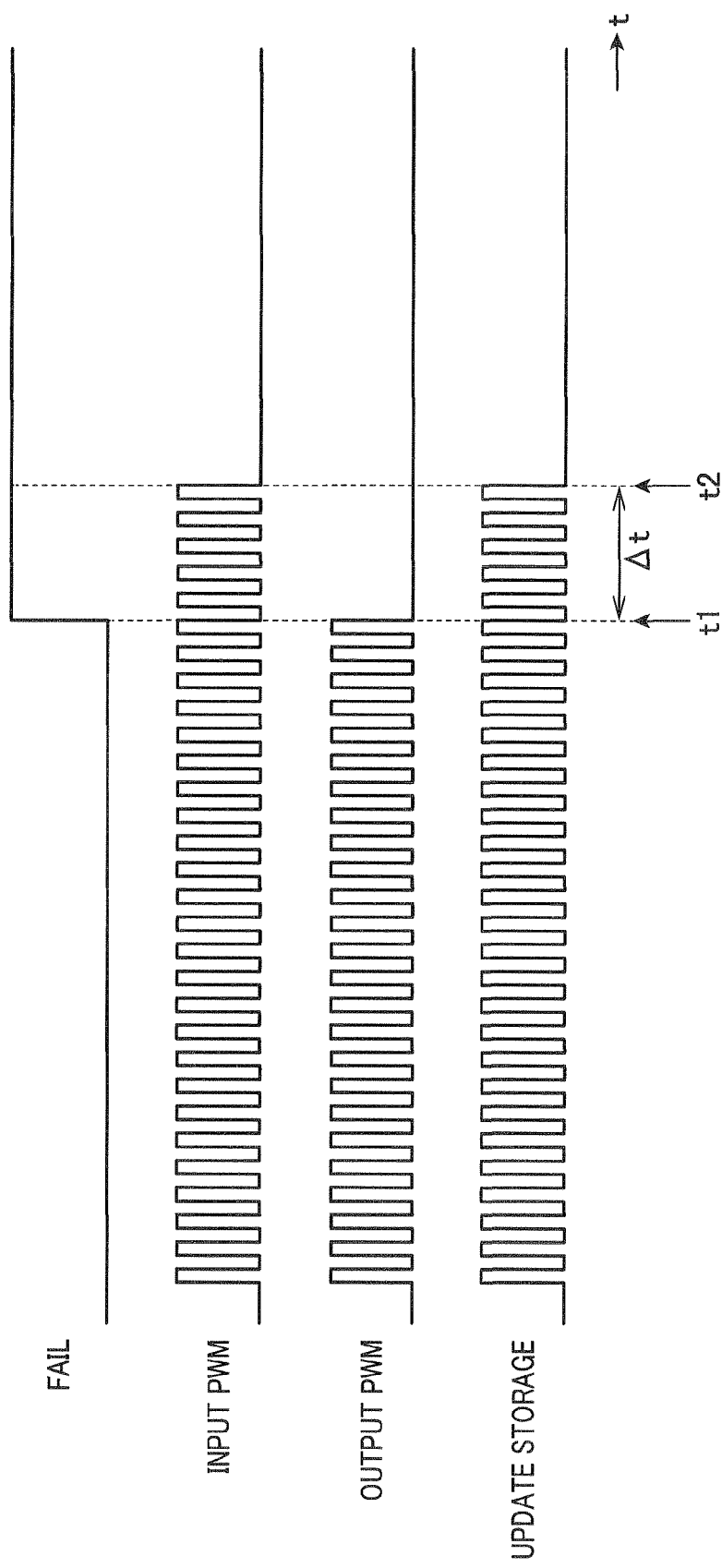
FIG. 4 is a timing chart showing another example of the actuation of the circuit control device shown in FIG. 2.

The drive signal output portion 24 may be connected to the malfunction detection portion 28 to receive the malfunction detection signal outputted from the malfunction detection portion 28. In this case, as shown in FIG. 4 (OUTPUT PWM in FIG. 4 shows the gate signal), the drive signal output portion 24 stops outputting the gate signal from the point when it has received the malfunction detection signal outputted from the malfunction detection portion 28 (i.e., shortly after time t1). That is, in this case, the drive signal output portion 24 itself has a function for stopping the output of the gate signal when malfunction occurs in the high-voltage system. For this, the function for stopping the output of the gate signal when malfunction occurs in the high-voltage system is provided in both of the main controller 21 and the drive signal output portion 24. Therefore, fail-safe function can be realized by using dual stopping means.

Figure 5:
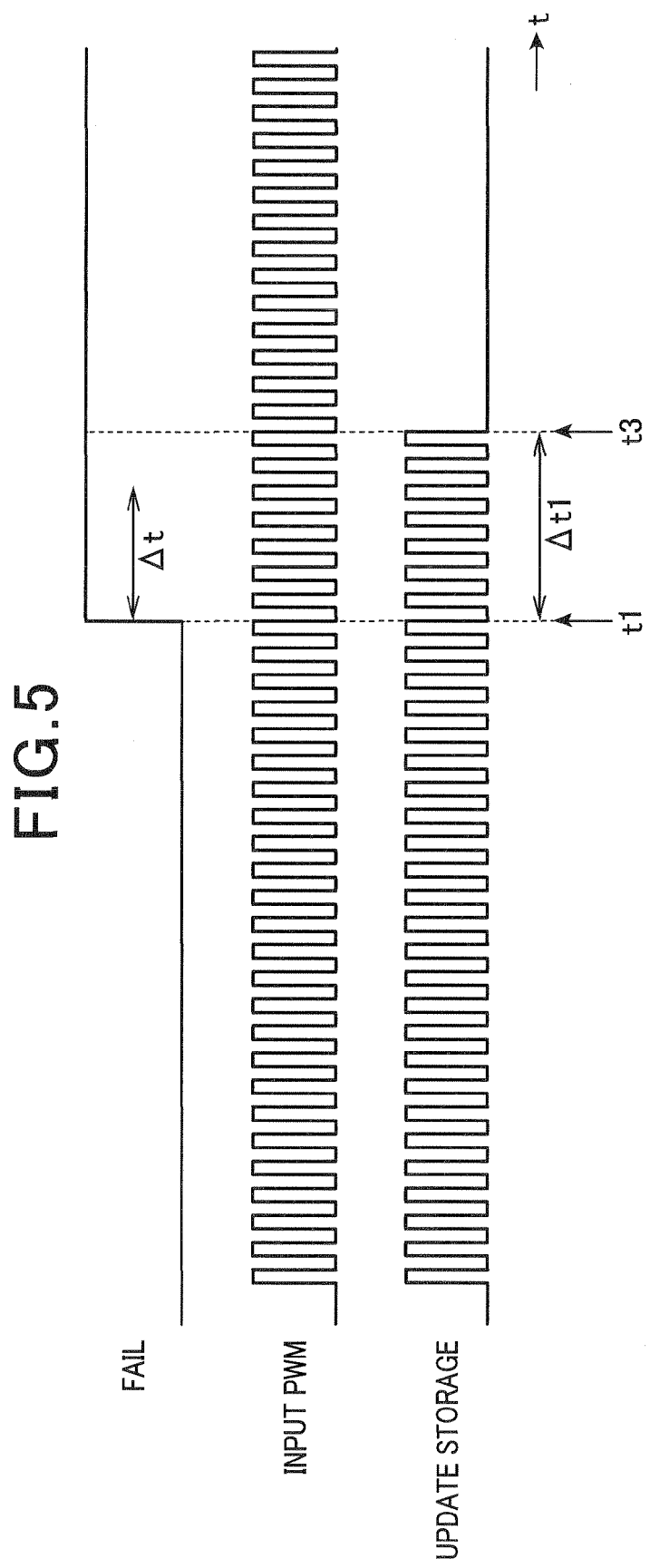
FIG. 5 is a timing chart showing another example of the actuation of the circuit control device shown in FIG. 2.

The sub controller 25 (storage processing portion 27) may be electrically connected to the malfunction detection portion 28 to receive the malfunction detection signal outputted from the malfunction detection portion 28. For example, a situation where malfunction in the transmission pathway of the malfunction detection signal causes the input or output of the drive control signal not to stop after the above-described time Δt has elapsed after time t1 in FIG. 5 is assumed. As shown in FIG. 5, when this situation occurs, the sub controller 25 (storage processing portion 27) may count time t3 and stop updating the circuit information in the storage medium 26 at time t3, after the above-described time Δt has elapsed after time t1. For this, the circuit information for the predetermined term before and after the occurrence of malfunction can be obtained, and the occurrence of malfunction in the transmission pathway of the malfunction detection signal can be detected.

The storage processing portion 27 and the malfunction detection portion 28 may be integrated in one functional block (or one element).

Figure 6:
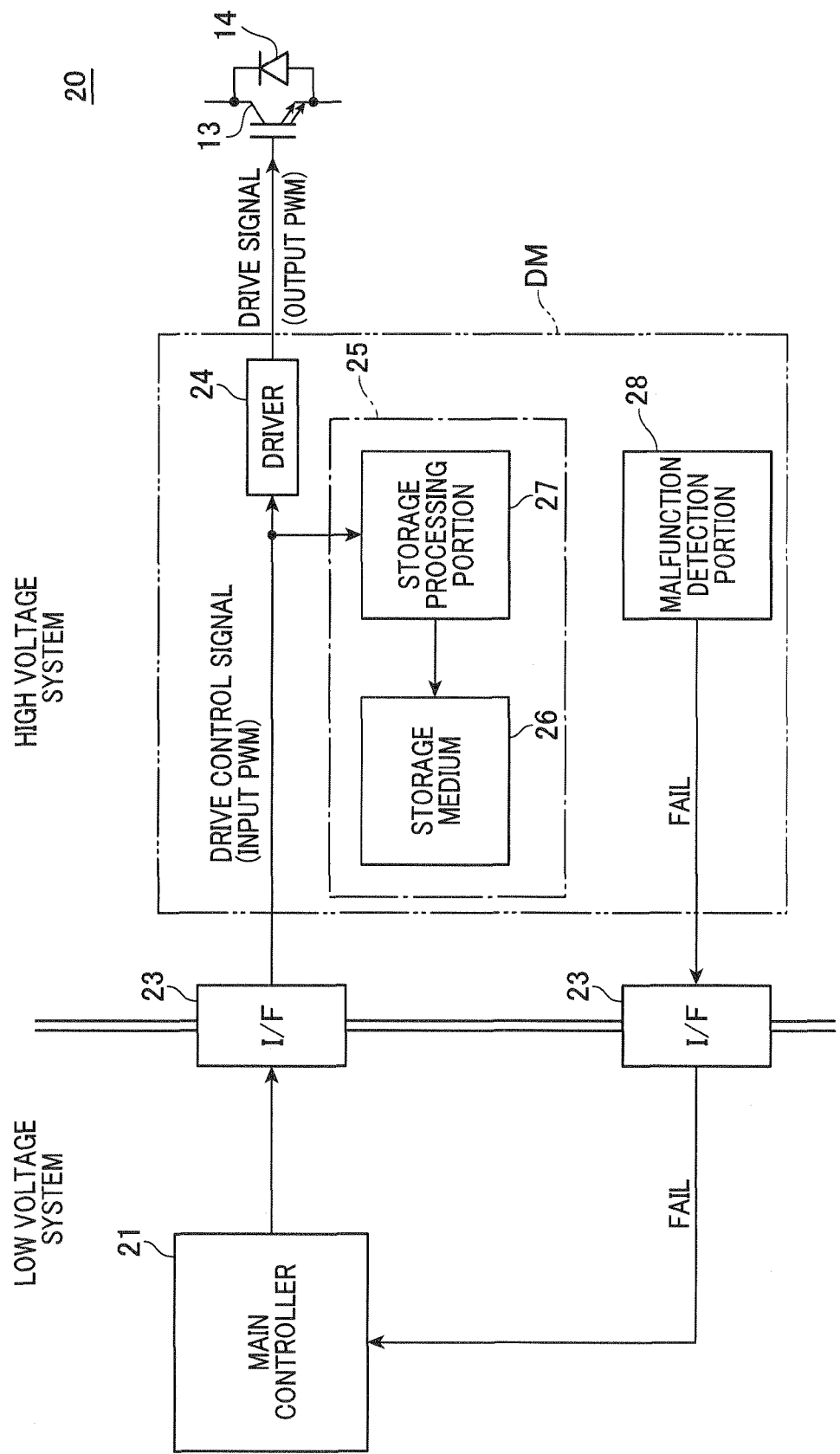
FIG. 6 is a diagram showing functional blocks in another example of the circuit control device shown in FIG. 1.

As shown in FIG. 6, the drive signal output portion 24, and at least one (preferably, all) of the storage medium 26, the storage processing portion 27 and the malfunction detection portion 28 may be integrated in one driver IC module DM. This enables a downsized device, and improves efficiency of signal transmission etc.

Figure 7:
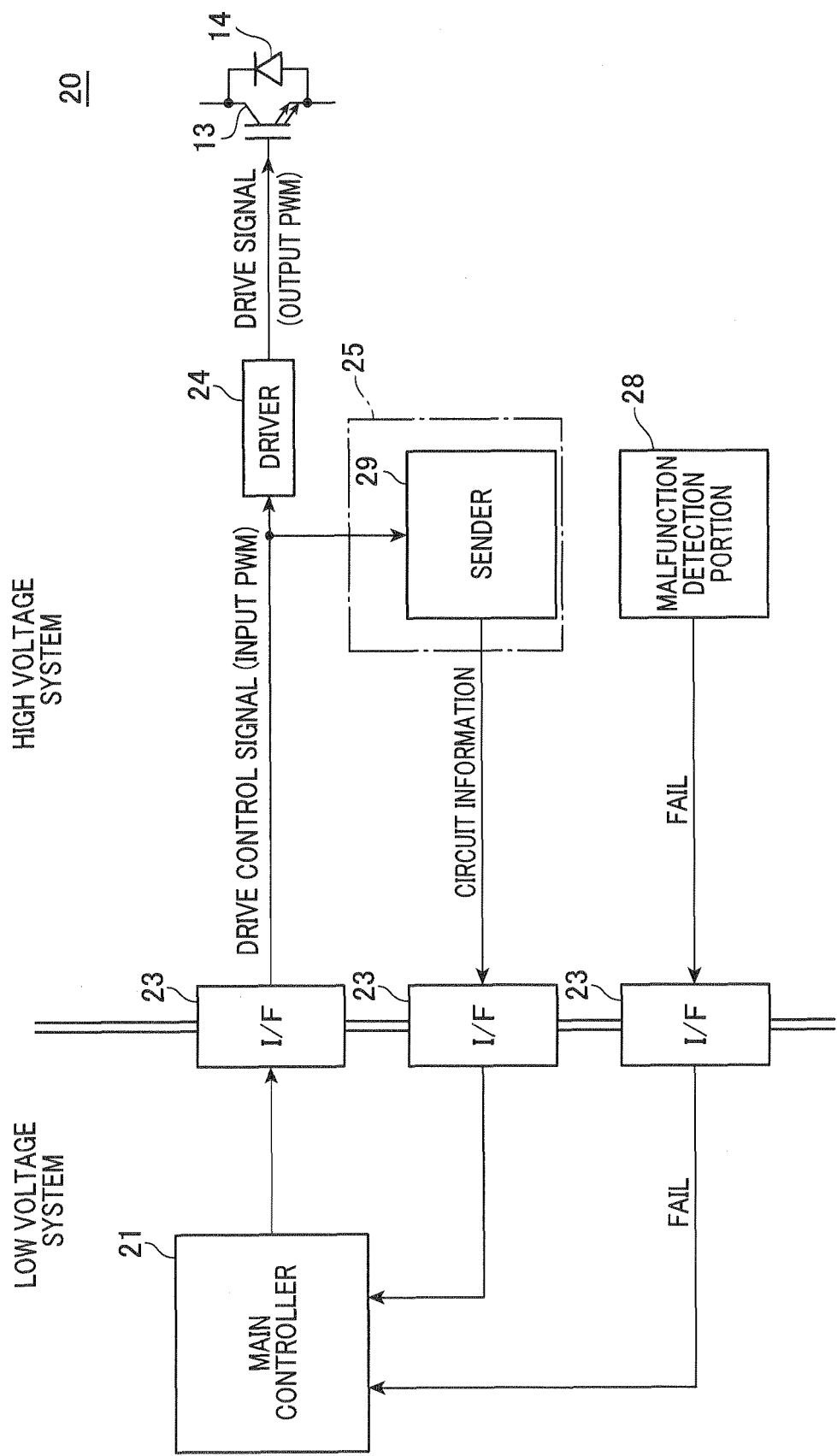
FIG. 7 is a diagram showing functional blocks in another example of the circuit control device shown in FIG. 1.
Figure 8:
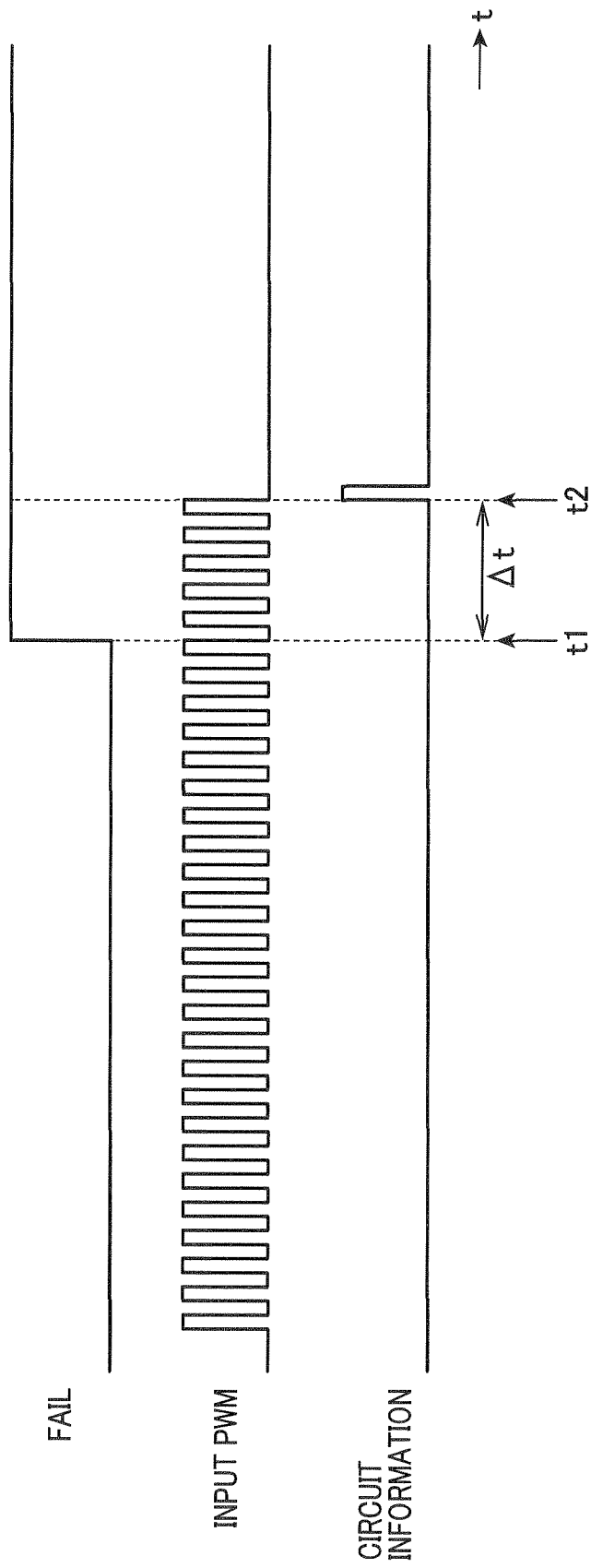
FIG. 8 is a timing chart showing an example of the actuation of the circuit control device shown in FIG. 7.

The sub controller 25 may have a sender 29 in place of the storage medium 26 and the storage processing portion 27, as shown in FIG. 7. The sender 29 obtains the circuit information, and sends the obtained circuit information to the main controller 21, at or after the point when the malfunction detection portion 28 has detected occurrence of the malfunction. In this case, as shown in FIG. 8, the sender 29 may be configured to be triggered by stop of the output of the drive control signal in the main controller 21 (stop of the input (reception) of the drive control signal in the sender 29) to start to send the circuit information to the main controller 21.

Figure 9:
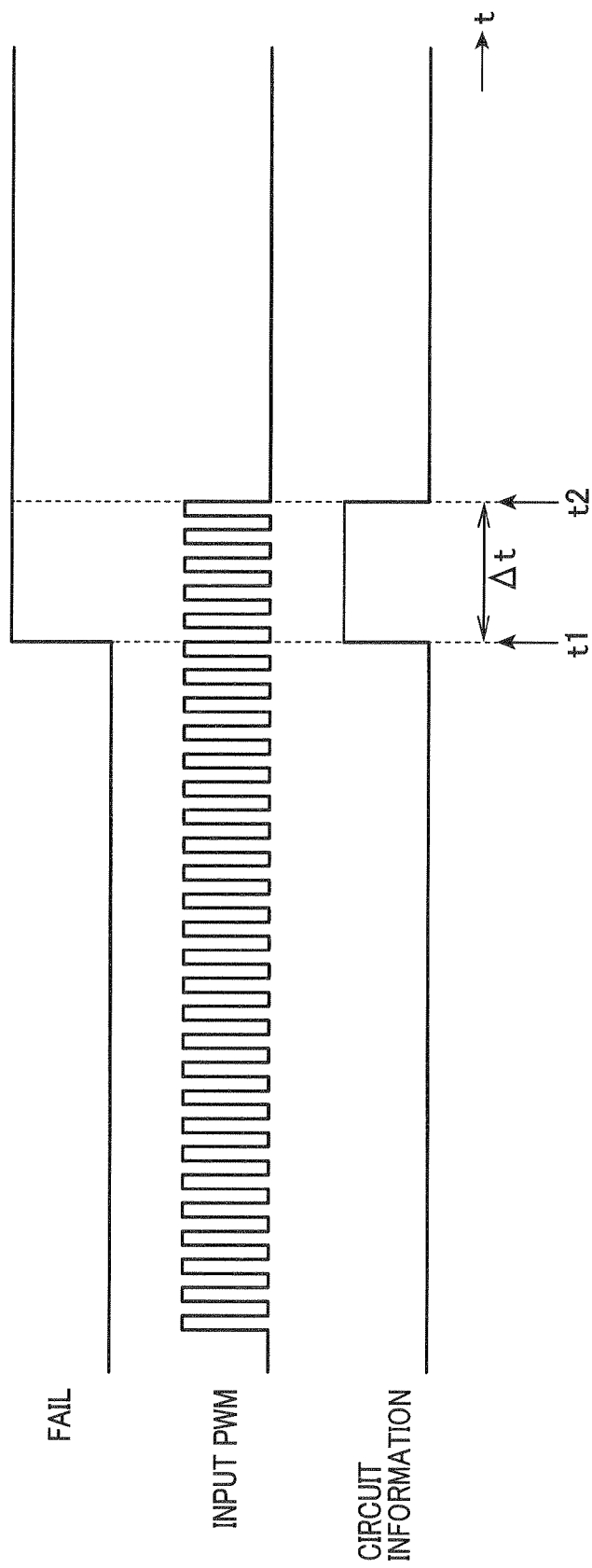
FIG. 9 is a timing chart showing another example of the actuation of the circuit control device shown in FIG. 7.

Alternatively, the sender 29 may be connected to the malfunction detection portion 28 to receive the malfunction detection signal outputted from the malfunction detection portion 28. In this case, as shown in FIG. 9, the sender 29 may be triggered by the reception of the malfunction detection signal to start to send the circuit information to the main controller 21. Then, the sender 29 may be triggered by stop of the output of the drive control signal in the main controller 21 (stop of the reception of the drive control signal in the sender 29) to stop sending the circuit information to the main controller 21. Here, the circuit information to be sent by the sender is the circuit information which has been obtained during sending thereof. Alternatively, the sender 29 may have a memory that holds the obtained circuit information temporarily, and send the circuit information in the memory to the main controller 21 in synchronization with the drive control signal.

Figure 10:
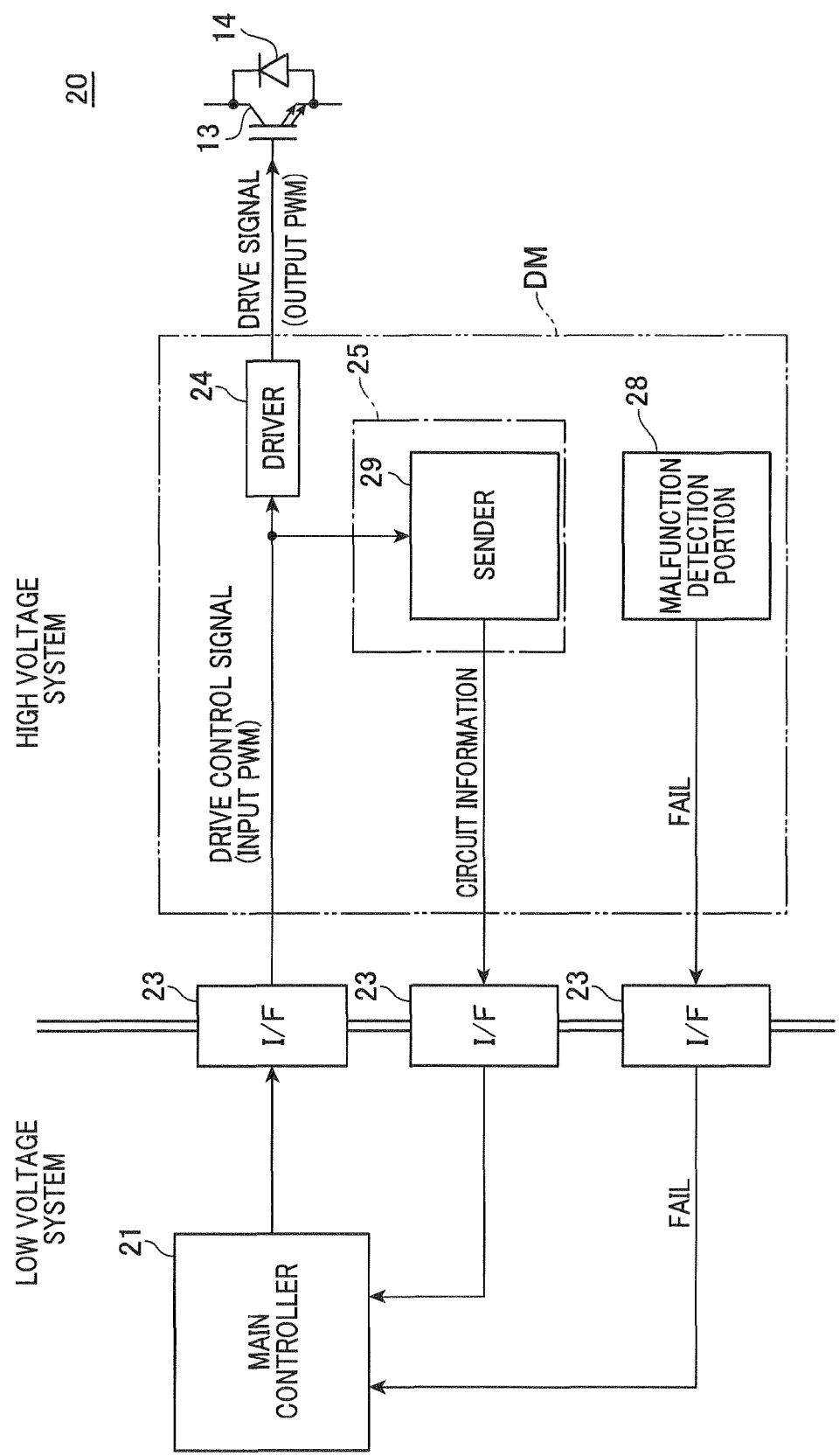
FIG. 10 is a diagram showing functional blocks in another example of the circuit control device shown in FIG. 1.

The malfunction detection portion 28 and the sender 29 may be integrated in one function block (or one element). As shown in FIG. 10, the drive signal output portion 24, and at least one (preferably, all) of the malfunction detection portion 28 and the sender 29 may be integrated in one driver module DM. This enables a downsized device, and improves efficiency of signal transmission etc.

The storage medium 26 in FIG. 2 etc. may be embedded in the main controller 21. In this case, the configuration in FIG. 2 etc. is substantially equivalent to the configuration in FIG. 7 etc.

Figure 3:
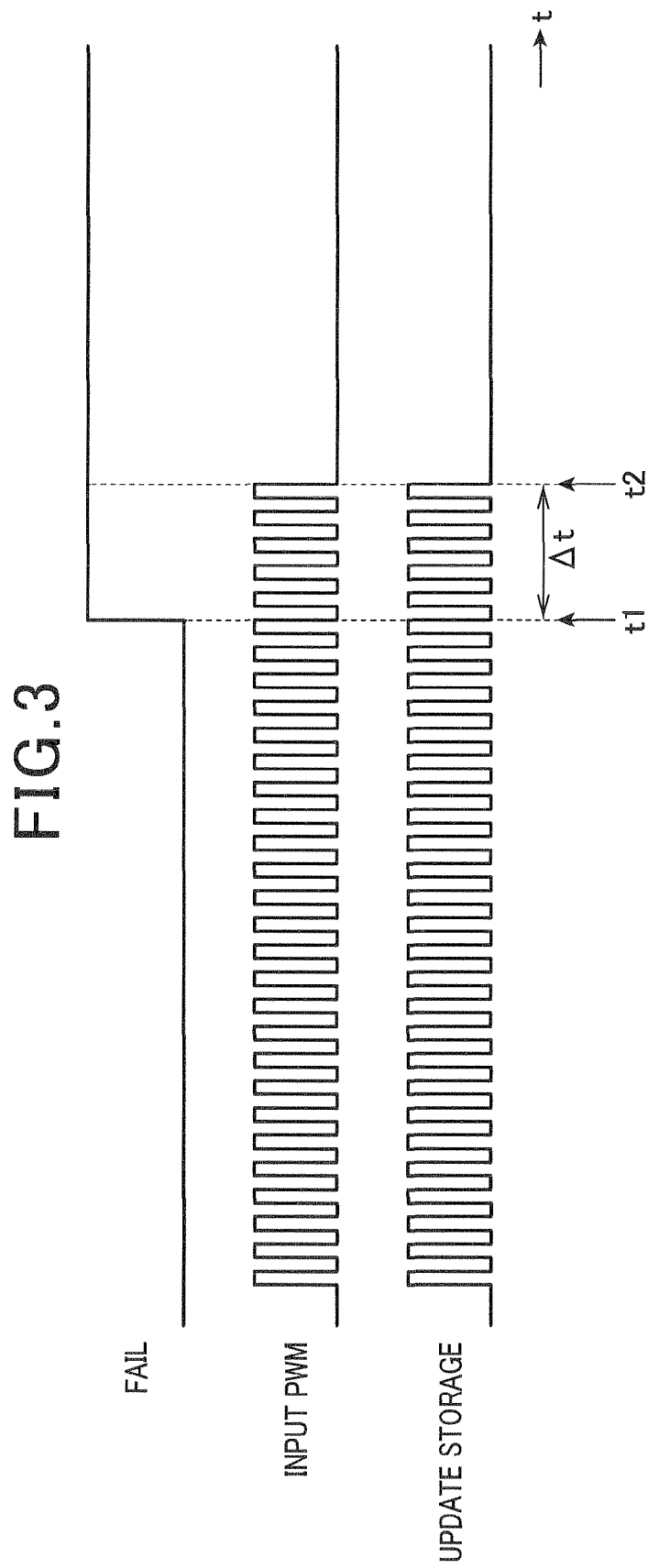
FIG. 3 is a timing chart showing an example of the actuation of the circuit control device shown in FIG. 2.

The updating period detecting period of the pulse is not limited to the same as the pulse period, as shown in the timing chart of FIG. 3. For example, the updating period may be whole-number multiple of the pulse period.

Though the invention has been described with respect to the specific preferred embodiments, many other variations and modifications will become apparent to those skilled in the art upon reading the present application. It is therefore the intention that the claims be interpreted as broadly as possible in view of the prior art to include all such variations and modifications.

The invention claimed is:

1. A circuit control device controlling a switching circuit which has a semiconductor switching element, comprising:
   a malfunction detection portion that detects occurrence of malfunction in the switching circuit and outputs a malfunction detection signal;
   a drive signal output portion that receives a drive control signal and outputs a drive signal to the switching element, the switching element acting on the basis of the drive signal, the drive control signal being a pulsed signal;
   a main controller outputs the drive control signal to the drive signal output portion and stops the output of the drive control signal when receiving the malfunction detection signal from the malfunction detection portion; and
   an obtaining portion that has storage medium that stores circuit information on status of the switching circuit except for the malfunction detection signal, that obtains the circuit information and that is triggered to update the stored content of the circuit information with the obtained circuit information by an input of the pulse of the drive control signal,
   wherein the obtaining portion obtains the circuit information after the detection of the malfunction and is triggered to update the stored content of the circuit information with the obtained information by the input of pulses of the drive control signal after the detection of the malfunction to the stop of the input of the drive control signal.

2. The circuit control device according to claim 1, wherein
the drive signal output portion receives the malfunction detection signal outputted from the malfunction detection portion, and
the drive signal output portion stops the output of the drive signal when receiving the malfunction detection signal or when the input of the drive control signal from the main controller stops.

3. The circuit control device according to claim 1, wherein
the obtaining portion has a sender; and
the sender sends the circuit information to the main controller, when or after the malfunction detection portion detects malfunction.

4. The circuit control device according to claim 3, wherein
the sender is triggered to send the circuit information to the main controller by the stop of the output of the drive control signal from the main controller.

5. The circuit control device according to claim 3, wherein
the sender is triggered to stop sending the circuit information to the main controller by the stop of the output of the drive control signal from the main controller.

6. The circuit control device according to claim 2, wherein
the main controller is provided in a low voltage system,
the malfunction detection portion, the drive signal output portion and the obtaining portion are provided in a high voltage system, and
the low voltage system and the high voltage system are connected through an interface.

7. The circuit control device according to claim 1, wherein
the main controller is provided in a low voltage system,
the malfunction detection portion, the drive signal output portion and the obtaining portion are provided in a high voltage system, and
the low voltage system and the high voltage system are connected through an interface.

* * * * *